United States Patent [19]
Kim et al.

[11] Patent Number: 5,885,344
[45] Date of Patent: Mar. 23, 1999

[54] NON-DASH NECK METHOD FOR SINGLE CRYSTAL SILICON GROWTH

[75] Inventors: Kyong-Min Kim, Charles; Sadasivam Chandrasekhar, St. Louis, both of Mo.

[73] Assignee: MEMC Electronic Materials, Inc., St. Peters, Mo.

[21] Appl. No.: 907,795

[22] Filed: Aug. 8, 1997

[51] Int. Cl.⁶ .................................................. C30B 15/32
[52] U.S. Cl. .............................. 117/13; 117/14; 117/15; 117/35; 117/902; 117/932
[58] Field of Search .................. 117/13, 14, 15, 117/35, 902, 932

[56] References Cited

U.S. PATENT DOCUMENTS

| | | | |
|---|---|---|---|
| 3,135,585 | 6/1964 | Dash | 23/301 |
| 3,759,670 | 9/1973 | Rummel | 23/301 SP |
| 5,126,113 | 6/1992 | Yamagishi et al. | 422/249 |
| 5,501,172 | 3/1996 | Murai | 117/15 |
| 5,578,284 | 11/1996 | Chandrasekhar | 423/348 |

FOREIGN PATENT DOCUMENTS

Hei 5-43379  2/1993  Japan.
Hei 8-319192 12/1996  Japan.

OTHER PUBLICATIONS

W. Dash "Growth of Silicon Crystals Free Dislocations" Journal of Applied Physics, vol. 30, No. 4 (Apr. 1959).
K. Kim et al. "Maximum Length of Large Diameter Czochralski Silicon Single Crystals at Fracture Stress Limit of Seed" Journal of Crystal Growth, vol. 100 (1990) pp. 527–528.

*Primary Examiner*—Robert Kunemund
*Attorney, Agent, or Firm*—Senniger, Powers, Leavitt & Roedel

[57] ABSTRACT

A non-Dash neck method of preparing a single crystal silicon rod, pulled in accordance with the Czochralski method. The process is characterized in that a large diameter, dislocation-free seed crystal is allowed to thermally equilibrate prior to initiation of silicon rod growth, in order to avoid the formation of dislocations resulting from thermal shock to the crystal. The process is further characterized in that a resistance heater is used to melt the lower tip of the seed crystal to form a molten cap before it is brought into contact with the melt. The process yields a single crystal silicon rod having a short, large diameter neck which is dislocation-free, and which is capable of supporting a silicon rod which weighs at least about 100 kilograms during growth and subsequent handling.

11 Claims, 4 Drawing Sheets

NON-DASH NECK METHOD FOR SINGLE CRYSTAL SILICON GROWTH

BACKGROUND OF THE INVENTION

The present invention relates generally to the preparation of a single crystal silicon rod grown according to the Czochralski method. More particularly, the invention relates to a non-Dash neck method of preparing a single crystal silicon rod, the rod having a short, thick neck which is dislocation-free.

Single crystal silicon, which is the starting material for most semiconductor fabrication processes, is commonly prepared by the Czochralski method. According to this method, polycrystalline silicon ("polysilicon") is charged to a crucible, which is contained within a crystal puller, and melted. A seed crystal, having a diameter which is typically within the range of 8 to 15 mm, is attached to a pull cable positioned above the melt and lowered until it is brought into contact with the molten silicon. A single crystal silicon rod is then grown by slowly pulling the seed crystal up from the surface of the melt.

As crystal growth begins, the seed crystal exists at a much lower temperature than the molten polysilicon. As a result, when the seed crystal comes into contact with the surface of the melt, it experiences a thermal shock. The thermal shock causes dislocations to be formed in the seed crystal. These dislocations are then propagated throughout the growing crystal and will continue to multiply unless they are eliminated in the neck, a region located between the seed crystal and the main body of the single crystal silicon rod.

The conventional method of eliminating these dislocations involves growing a neck which has a small diameter (typically 2 mm to 4 mm) at a high pull rate (as high as 6 mm/min). This method acts to "squeeze" the neck in order to completely eliminate dislocations before growth of the body of the single crystal silicon rod begins. These dislocations are typically eliminated when the neck, also known as a Dash neck, is grown to a length of up to 100 to 150 mm.

Once the dislocations in the neck have been eliminated, the diameter of the neck is slowly increased until the desired diameter of the body of the single crystal silicon rod is achieved. The body is pulled from the melt until most of the polysilicon is depleted. The diameter is then gradually decreased to a point at which the rod may be separated from the crucible and then removed from the crystal puller.

In addition to the process delays involved with the formation of a neck of this length, problems also arise from the fact that the neck is the weakest point of the crystal and yet is responsible for supporting the entire weight of the single crystal silicon rod. Necks having such a small diameter can fracture during crystal growth, causing the body of the crystal to drop into the crucible. The impact of the crystal ingot and the resulting splash of molten polysilicon can destroy the crucible, susceptor and heater, render the polysilicon melt unsalvageable, and present a serious safety hazard. The neck may also fracture during subsequent manipulation of the single crystal silicon rod after the growth process has been completed. As a result of these potential dangers, a conventional 200 mm diameter crystal having a Dash neck is typically grown to a weight of about 100 kilograms or less, in order to minimize the likelihood of neck fractures.

It has been reported that the diameter of the neck is directly related to the weight of the ingot that can be supported. (See, e.g., Kim et al., *Journal of Crystal Growth*, 100 (1990), pp. 527–28.) Attempts have thus been made to minimize equipment and raw material losses, as well as safety hazards, that may result from neck fractures by increasing the diameter of the neck. For example, Japanese Kokai No. 05-43379 describes a method of eliminating dislocations while forming a neck having a diameter greater than that of a Dash neck. Dislocations are removed as the neck is grown at a rate ranging from 4 mm/min to 6 mm/min and maintained at a constant diameter, ranging from 4.5 mm to 10 mm, for a length ranging from 30 mm to 200 mm. When the neck diameter exceeds 10 mm, however, dislocations are said to be difficult to eliminate.

In contrast, U.S. Pat. No. 5,578,284 describes a process whereby dislocations are removed from a neck having a diameter which exceeds 10 mm. This process employs a pull rate of less than 4 mm/min and requires a neck length of between 120 mm and 180 mm. It is said that for necks of this diameter, a pull rate of less than 4.0 mm/min results in dislocations being annihilated more quickly than they are formed.

Other attempts to reduce neck fractures have focused on providing additional mechanical support for the crystal body. For example, U.S. Pat. No. 5,126,113 describes an apparatus for supporting a single crystal silicon rod as it is grown. Dislocations in the crystal are eliminated by growing a small diameter neck by the Dash method. A large diameter bulge is then grown beneath the Dash neck before the start of the conical section of the crystal body. Mechanical grips engage the recess beneath the bulge to support the body as it is grown. However, when grips such as these are used to hold the crystal, the steady crystal growth operating conditions may be disturbed, which may also cause the Dash neck to fracture.

In view of these developments, a need continues to exist for a process which eliminates dislocations within the neck of a single crystal silicon rod, such that larger diameter, dislocation-free silicon rods may be produced without substantial equipment damage, loss of raw materials, creation of safety hazards, and reduced throughput and yield.

SUMMARY OF THE INVENTION

Among the objects of the invention, therefore, may be noted the provision of a process for preparing a single crystal silicon rod, pulled in accordance with the Czochralski method, having a short, large diameter neck which is dislocation-free; the provision of a process for preparing a single crystal silicon rod having a short, large diameter neck which is capable of supporting a heavy silicon rod body without fracturing during crystal growth or handling; the provision of a process for preparing a single crystal silicon rod having a short, large diameter neck which allows for a reduction in growth time and an improvement in overall production yield and throughput.

Briefly, therefore, the present invention is directed to a process for initiating growth of a single crystal silicon rod in accordance with the Czochralski method, the process comprising:

heating a lower tip of a dislocation-free seed crystal using a resistance heater until the tip melts and form a molten cap, lowering the seed crystal until the molten cap comes into contact with the surface of a melt, and pulling the seed crystal up from the melt to form a neck adjacent the seed crystal.

The present invention is further directed to a process for initiating growth of a single crystal silicon rod in accordance with the Czochralski method, the process comprising:

lowering a dislocation-free seed crystal to a position above a silicon melt surface, moving a secondary heater to an initial position adjacent the seed crystal in order to melt a lower tip of the seed crystal and form a molten cap, lowering the seed crystal until the molten cap contacts the silicon melt surface, and withdrawing the heater to a secondary position relative to the silicon melt surface.

Other objects and features of this invention will be in part apparent and in part pointed out hereinafter.

DETAILED DESCRIPTION OF THE PREFERRED EMBODIMENTS

Figure 1:
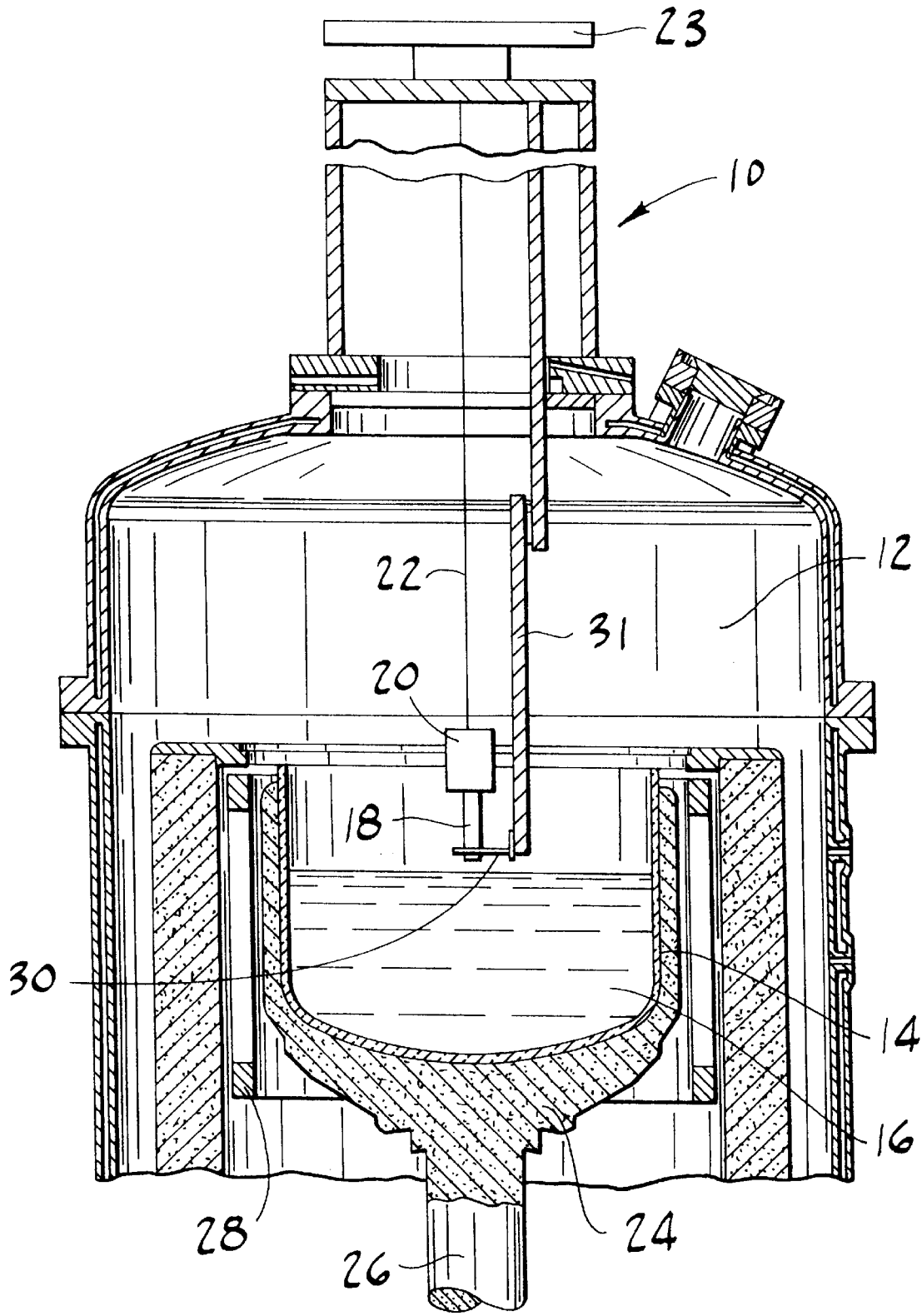
FIG. 1 is a schematic, sectional view of an example of a crystal puller in which the one embodiment of the secondary heater is indicated in accordance with the process of the present invention.

Referring now to FIG. 1, a Czochralski crystal puller constructed in accordance with the principles of the present invention is indicated generally at 10. Within the crystal growth chamber 12 is a crucible 14, which has an open top and which contains a quantity of molten silicon. A single crystal silicon rod (not shown) is pulled from a melt 16, starting from a seed crystal 18 which is held in a chuck 20 attached to a pull cable 22. The pull cable 22 is rotated and raised and lowered as necessary by operation of a support structure 23. The crucible 14 is mounted on a turntable, or susceptor, 24 having a shaft 26 connected to a crucible drive unit (not shown) for rotating and raising and lowering the crucible as necessary.

To grow a single crystal silicon rod in accordance with the process of the present invention, a quantity of polysilicon is charged to the crucible 14 and an electric current is passed through the cylindrical heater 28 which surrounds the crucible 14 to melt the charge. The seed crystal 18, which is dislocation-free, typically has a minimum diameter, $d_s$, ranging from about 8 mm to about 15 mm or more. Preferably, the seed crystal will have a minimum diameter ranging from about 9 mm to about 13 mm and, most preferably, a minimum diameter range from about 10 mm to about 12 mm.

The seed crystal 18 and the crucible 14 are rotated as the seed crystal is lowered to a position above the melt 16 which allows the radiant heat from the melt to raise the temperature of the lower seed crystal tip until the tip reaches thermal equilibrium with the ambient at this position, typically achieving a temperature within the range of about 1225° C. to about 1375° C. Stated another way, the seed crystal 18 is held in this position until the temperature at each point on the radius of the seed crystal tip is generally within the range of about 1225° C. to about 1375° C. The rotation rate of the seed crystal will typically range from about 10 to about 18 rpm and will preferably range from about 14 to about 16 rpm, while the rotation rate for the melt/crucible will typically range from about 2 to about 10 rpm.

Experience has shown that it typically requires from about 10 to about 20 minutes for the temperature of the seed crystal tip to be within the range of about 1225° C. to about 1375° C. Preferably, the temperature of the tip is within the range of about 1250° C. to about 1350° C. and, most preferably, within the range of about 1275° C. to about 1325° C. To achieve thermal equilibrium, typically the seed crystal 18 is lowered to a distance of about 5 mm to about 15 mm above the surface of the silicon melt 16. Preferably, the seed crystal 18 is lowered until it is about 7 mm to about 12 mm above the surface of the melt.

Figure 2:
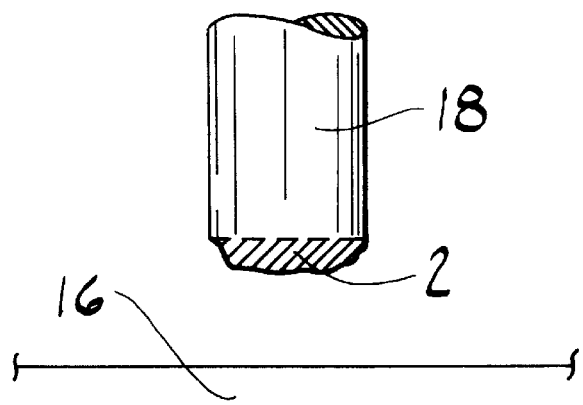
FIG. 2 is a vertical section illustrating an example seed crystal after having been sufficiently heated by a secondary heater so as to cause the formation of a molten cap, the shaded area generally showing the molten cap and the dotted line approximately denoting a transitional region from the solidified silicon of the seed to the molten silicon of the molten cap.

Referring now to FIGS. 1 and 2, after the seed crystal 18 has thermally equilibrated, the temperature of the lower tip of the seed crystal is slowly increased by the application of heat via a secondary heater 30, which is initially positioned adjacent to the seed crystal. Heating is continued until the tip melts, forming a molten cap 2 which has a generally convex shape at the lower tip of seed crystal 18. Typically, the molten cap will be formed by melting the tip until the length of molten silicon comprising the cap ranges from about 2 mm to about 5 mm. Preferably, the molten cap 2 will be formed by melting the tip until the length of molten silicon ranges from about 3 mm to about 4 mm. It is to be noted that heating can be continued to form a molten cap having a greater length. However, if heating and melting of the tip continues until the length of the molten cap 2 generally exceeds the diameter of the seed crystal 18, the molten cap may fall away from the seed crystal tip and should therefore be avoided. It is also to be noted that heating must be done slowly, typically over a period of about 15 to about 20 minutes, in order to avoid the formation of dislocations in the seed crystal as a result of thermal shock.

Figure 3:
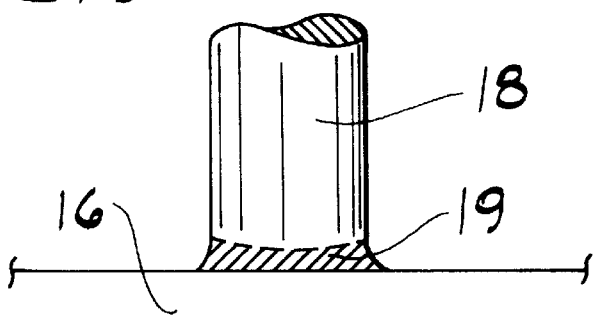
FIG. 3 is a vertical section illustrating an example seed crystal in contact with the melt, the shaded area generally showing a meniscus of molten silicon and the dotted line approximately denoting a transitional region from the solidified silicon of the seed to the molten silicon of the meniscus.

Referring now to FIGS. 1 and 3, the seed crystal 18 is then slowly lowered, typically at a rate of about 0.5 mm/min. to about 4 mm/min., until the molten tip comes into contact with the surface of the melt 16. Once this occurs, lowering of the seed crystal is stopped. The secondary heater 30 is turned off and then the unit is withdrawn to a secondary position relative to the surface of the melt by means of a motor driven, vertically sliding mechanism 31 in order to avoid interfering with the growth process as it proceeds.

The position of the seed crystal 18 is maintained for about 5 to about 20 minutes. During this period, as it commonly done in the art, the diameter of a meniscus 19 at the seed/melt interface is visually monitored for signs that the melt is too hot or cold. For example, if the diameter of the meniscus is larger than that of the seed crystal, the melt is too cold. Conversely, if the diameter of the meniscus is less than that of the seed crystal, the melt is too hot. As circumstances dictate, the rotation rate of the melt/crucible may be increased (if the melt is too hot) or decreased (if the melt is too cold) by about 0.2 rpm to about 1 rpm. The diameter of the meniscus is monitored in this way in order to ensure that it generally about the same as the diameter of the seed crystal before neck growth begins.

Figure 4:
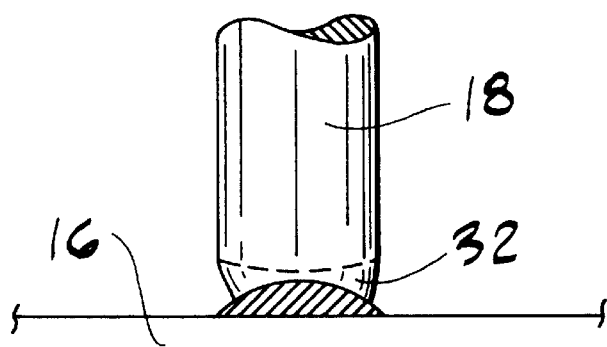
FIG. 4 is a vertical section illustrating an example of the initial stage of formation of the neck portion of single crystal silicon, the dotted line generally indicating a transitional region from the seed crystal to the initial tapering of the neck, and the shaded area indicating the meniscus of molten silicon present between the solidified silicon of the neck and the molten silicon of the melt.
Figure 5:
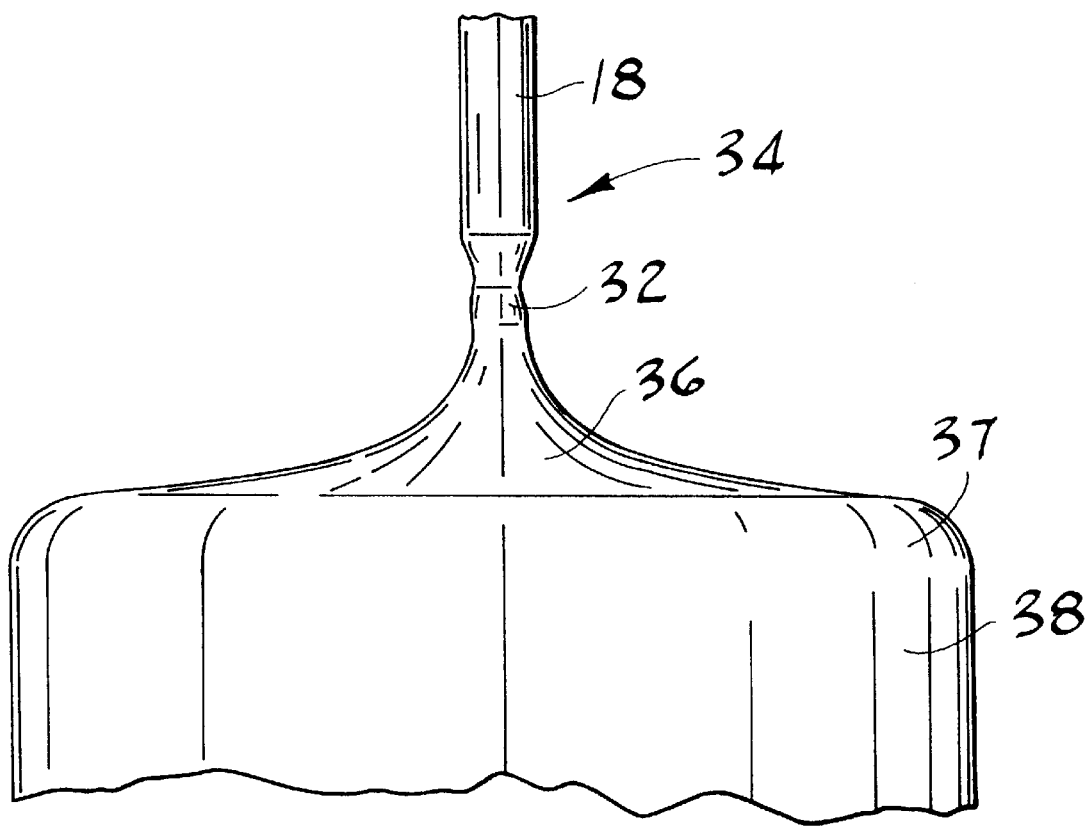
FIG. 5 is a vertical section illustrating an example of the upper region of a single crystal silicon rod prepared in accordance with the process of the present invention.
Figure 6:
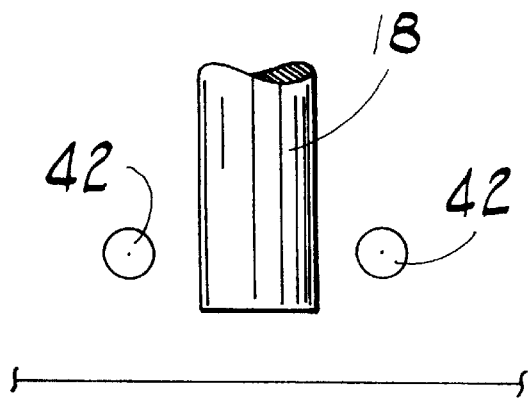
FIG. 6 is a side plan view of a preferred embodiment of the resistance heater tubes and their position relative to the seed crystal and the surface of the melt.
Figure 7:
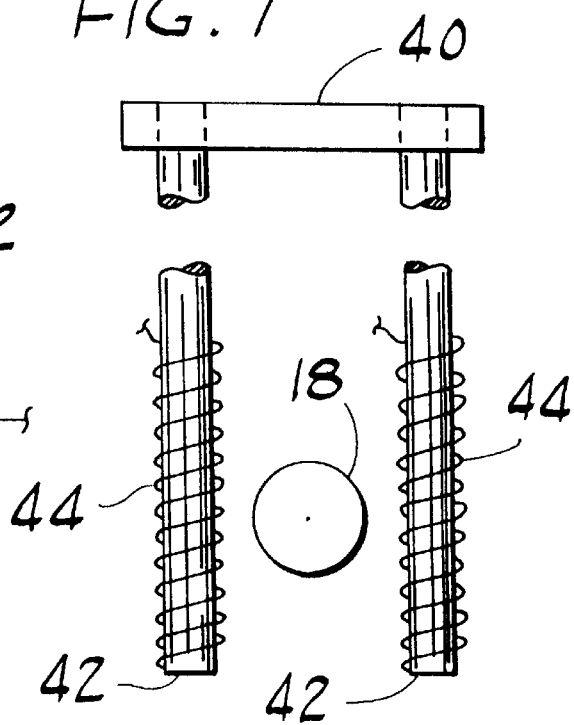
FIG. 7 is a bottom plan view of a preferred embodiment of the resistance heater and the position of the tubes relative to the seed crystal.
Figure 8A:
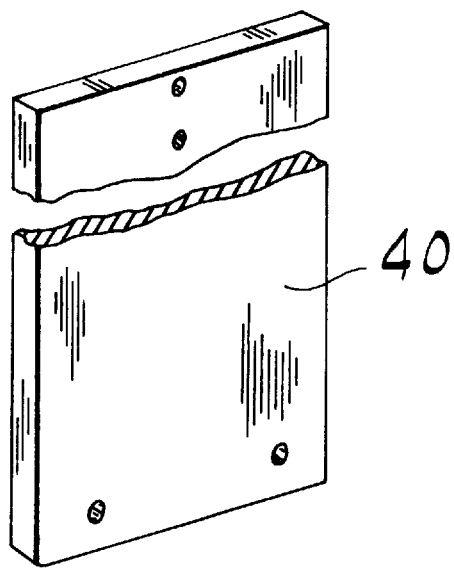
FIGS. 8a and 8b are fragmentary views of a preferred embodiment of the resistance heater.
Figure 8B:

Referring now to FIGS. 4 and 5, once the desired meniscus diameter is achieved, formation of a neck 32 of a single crystal silicon rod, indicated generally at 34, is begun by slowly pulling the seed crystal 18 in an upward direction away from the surface of the melt. Generally, the pull rate will be slow enough to sustain the formation of a dislocation-free neck having a minimum diameter ranging from about 7 mm to about 15 mm or more. Typically, therefore, the pull rate during neck formation is sufficient to maintain the neck 32 at a minimum diameter, $d_n$, which is slightly less than the minimum diameter of the seed crystal 18, $d_s$. Preferably, the ratio of the neck diameter to seed diameter, $d_n$ to $d_s$, is between about 0.7 to about 1. More preferably, the ratio is between about 0.75 to about 0.95 and, most preferably, the ratio is between about 0.8 and about 0.9. In order to maintain a dislocation-free neck of this diameter, the pull rate will typically range from about 0.4 mm/min to about 2.0 mm/min. Preferably, the rate will range from about 0.7 mm/min to about 1.2 mm/min.

Neck formation is typically maintained until a length of less than about 30 mm is achieved. Preferably, the length of the neck will be less than about 20 mm. Most preferably, the length will be less than about 15 mm. It is to be noted that a dislocation-free neck is maintained in accordance with the process of the present invention even if the length exceeds 30 mm. However, experience has shown that a length which exceeds 30 mm is not required and, therefore, to exceed this length result in the unnecessary extension of process time.

Once formation of the dislocation-free neck 32 is complete, the remainder of the process proceeds in a manner similar to the conventional Czochralski method. An outwardly flaring, or seed-cone, segment 36 is grown adjacent the neck 32. The seed-cone is grown by continually increasing the diameter of the neck by decreasing the melt temperature, which is achieved by lowering the heater power, while keeping the pull rate about the same. It is to be noted in this regard that the present process differs from the standard, Dash neck method in that seed-cone formation for the Dash neck method involves a significant decrease in pull rate. This is because pull rates as high as 6 mm/min are required to eliminate dislocations in the Dash neck. Therefore, to initiate seed-cone formation, the pull rate is significantly decreased so that the diameter can be progressively increased.

A shoulder 37 is formed when the desired diameter of a single crystal silicon rod body 38 is reached, by a transient increase in the pull rate. The pull rate is then maintained as the body 38 is grown at the same diameter as the shoulder 37. A tapered end-cone (not shown) is formed when the melt is nearly depleted by increasing the pull rate and melt temperature.

The secondary heater 30 (as shown in FIG. 1), which is used to further heat and melt the seed crystal tip, may be designed in accordance with any embodiment that is sufficient to generally heat the tip of the seed crystal 18. However, the heater must be constructed of a material which is capable of withstanding temperatures common to the crystal pulling process, and which does not act as a source of contaminants.

As a result of the need to avoid thermal shock to the seed crystal tip, resistance heating is preferred over heating by an optical or light energy source, such as a laser. The radiant heat generated by a resistance heater provides a means by which to gradually increase the temperature across the entire crystal tip, generally over a period of about 10 to about 20 minutes. In contrast, heating by laser is localized and tends to be more difficult to control as a result. In addition, resistance heating is preferred over a laser because it does not carry with it a number of the potential safety risks created by the use of a laser.

Referring now to FIGS. 6, 7, 8a and 8b, a preferred embodiment of the secondary heater 30 will be described. In the preferred embodiment, a resistance heater is employed which comprises a base plate 40 to which is mounted two pieces of tubing 42. The tubing are separated by a distance which is sufficient for the seed crystal 18 to fit between them when the heater is in position. Typically, the distance between the tubing 42 will be about 2 cm to about 5 cm and, preferably, the distance will be about 3 cm to about 4 cm. Preferably, the plate 40 and the tubing 42 are constructed of alumina. Wires 44, which are preferably constructed of tantalum, are wound around each tubing 42 and serve as the heating element of the resistance heater.

It is to be understood that the materials of the plate 40, tubing 42 and wires 44, as well as the spacing of the tubing, may be other than that described without departing from the scope of the present invention.

The plate 40 is attached to the vertically sliding mechanism 31 (as shown in FIG. 1) by means standard in the art. This allows for the resistance heater to be positioned above the melt 16 such that the seed crystal 18 extends between the tubing 42. After the seed crystal tip has been heated to the point of molten cap formation and then further lowered in order to contact the melt surface, as described above, the resistance heater is withdrawn from its initial position to a secondary position relative to the silicon melt surface 16, which is generally above and away from the surface of the melt. This is done so that the heater is not in a position that will interfere with crystal growth as the pulling process continues. At this secondary position, the heater is no longer capable of supplying heat sufficient to maintain the seed crystal tip in a molten state.

The resistance heater is attached to a DC power supply (not shown) by means which are common to the art. In order to further heat, and subsequently melt, the tip of the seed crystal 18, power is supplied to the heater in a manner sufficient to slowly heat the seed crystal tip. Slow heating is critical in order to avoid formation of dislocations in the seed crystal 18 as a result of thermal shock. Typically, over a period of about 10 to about 20 minutes and, preferably, over a period of about 14 to about 16 minutes, power to the heater will be increased from about 50 watts to about 100 watts. The power which is supplied acts to heat the wires 44 which are wound around the tubing 42. The power supply is maintained for a duration which is sufficient for the heat radiating from the wires 44 to cause the tip of the seed crystal 18 to melt, resulting in the formation of a molten cap.

Detection of dislocations in the single crystal silicon rod may be achieved by a number of methods which are conventional in the art. For example, during the growth of the single crystal silicon rod, the presence of facet lines on the crystal surface is a clear indication and proof of the absence of dislocations in the crystal. After the silicon rod is pulled, it can also be sliced into wafers which can then be analyzed for dislocations using methods common to the art. An absence of dislocations in the wafers leads to the conclusion that the silicon rod is free of dislocations. Alternatively, after the neck is formed, it may be analyzed by chemical etching to reveal any dislocations. Following this method, the (110) faces of an axial section of the entire neck may be ground, mechanically polished, and then chemically polished for ten minutes in a 10:3:1 HOAc:HNO$_3$:HF solution to remove any surface damage. The faces are then Wright etched for 20 minutes to reveal dislocation etch pits. No pits will be observed if the neck is dislocation-free.

It is to be noted that experience has shown that generation of a new dislocation in the dislocation-free single crystal silicon rod 34 is exceedingly difficult under growth conditions prevailing in a conventional Czochralski puller. As a result, the single crystal silicon rod should remain free of dislocations once the formation of the dislocation-free neck 32 is successfully completed in accordance with the process of the present invention.

The process of the present invention provides a means by which to prepare a dislocation-free single crystal silicon rod that typically has a weight which ranges from at least about 100 kilograms to about 200 kilograms, 300 kilograms, 400 kilograms or more. In addition, the present invention results in an increase in yield and throughput because of the fact that the dislocation-free neck which is formed is about one-tenth the length of a neck formed by the standard, Dash-type technique.

As illustrated in the following Example, the process of the present invention could be used to prevent the formation of dislocations in the neck of a single crystal silicon rod which is prepared according to the Czochralski method. The Example sets forth one set of conditions that could be used to achieve the desired result. Data similar to that which is provided below could be generated for other crystal diameters and weights. Accordingly, the Example should not be interpreted in a limiting sense.

EXAMPLE

A single crystal silicon ingot having a diameter of about 200 mm and a weight of at least about 100 kg can be prepared in accordance with the process of the present invention using a Ferrofluidic Czochralski crystal puller and a 24 inch diameter crucible, to which is charged 120 kg of polysilicon doped with boron. Power is supplied to the cylindrical heater which surrounds the crucible in order to melt the polysilicon. The resistance heater and the seed crystal are position in the crystal puller away from the hot zone in order to prevent silicon monoxide gas, which is generated during melting of the polysilicon charge, from condensing on their surfaces.

Once the charge is melted, the resistance heater is lowered to an initial position about 15 mm above the center of the melt surface by means of the vertically sliding mechanism. The heater is allowed to thermally equilibrate for about 20 to about 30 minutes, and then a dislocation-free silicon seed crystal about 9 mm in diameter and 160 mm in length is lowered into position. The tip of the seed crystal is positioned between the tubing which extends from the heater, the tip being about 2 to 3 mm below the tubing and about 12 to 13 mm from the surface of the melt.

The crystal is allowed to thermally equilibrate with the temperature inside the puller at this position for about 15 minutes, at which time heating by the resistance heater is begun. Over about a 15 minute period, power to the heater is increased from about 50 watts to 100 watts, during which time the tip of the seed crystal begins to melt. Eventually, a molten cap of about 3 to about 4 mm in length is formed.

Once the molten cap is formed, power to the heater is decreased to zero over about a 5 minute period, during which time the seed crystal is lower at a rate of about 2 mm/min toward the melt surface. Lowering of the seed is continued until the molten cap contacted the surface of the melt; the seed and melt being rotated at rates of about 15 rpm and about 8 rpm, respectively. Once the molten cap contacts the surface of the melt, lowering is stopped. The heater is then moved in an upward direction away from the surface of the melt to a secondary position relative to the melt surface.

The seed is held at this position for about 10 to about 15 minutes, during which time the shape of the meniscus at the seed/melt junction is visually monitored for indications that the melt is too hot or cold (as determined by comparing the diameter of the meniscus to that of the seed crystal). Adjustments are made as needed by increasing or decreasing the rotation rate of the melt/crucible by about 0.2 to 1 rpm, respectively.

Once the diameter of the meniscus is generally about the same as that of the seed crystal, neck growth begins at a rate of about 1.0 mm/min. A short, thick neck having a diameter of about 8 to 9 mm and a length of about 18 to 20 mm is grown. The seed-cone is then grown by reducing the pull rate to about 0.6 mm/min and slightly reducing power to the cylindrical heater. The remaining sections of the single crystal silicon ingot, including the shoulder section, the constant diameter body section, and the end-cone section are then grown according to conventional Czochralski process parameters which are standard to the art.

Once growth of the single crystal silicon ingot is complete, the neck is visually inspected for the presence of facet lines in the [100] crystal growth orientation. The presence of these lines is noted as visual proof of dislocation-free growth.

As various changes could be made in the above method without departing from the scope of the invention, it is intended that all matter contained in the above description shall be interpreted as illustrative and not in a limiting sense.

What is claimed is:

1. A process for initiating growth of a single crystal silicon rod in accordance with the Czochralski method, the process comprising:

lowering a dislocation-free seed crystal to a position above a silicon melt surface, moving a secondary heater to an initial position adjacent the seed crystal, heating the seed crystal with the heater to melt a lower tip of the seed crystal and form a molten cap, lowering the seed crystal until the molten cap contacts the silicon melt surface, and withdrawing the heater to a secondary position relative to the silicon melt surface.

2. The process as set fourth in claim 1 wherein melting of the lower tip of the seed crystal is achieved by heating the tip over a period of about 14 to about 16 minutes.

3. The process as set fourth in claim 1 wherein the secondary heater is a resistance heater.

4. The process as set forth in claim 1 wherein the dislocation-free seed crystal, after the molten cap contacts the surface of the melt, is pulled up from the silicon melt in order to form a dislocation-free neck adjacent the seed crystal.

5. The process as set forth in claim 4 wherein the dislocation-free neck has a length of less than about 30 mm.

6. The process as set forth in claim 4 wherein the dislocation-free neck has a length of less than about 20 mm.

7. The process as set forth in claim 4 wherein the dislocation-free seed crystal has a minimum diameter $d_s$ and the dislocation-free neck has a minimum diameter $d_n$, the ratio of $d_n$ to $d_s$ ranging from about 0.7 to about 1.

8. The process as set forth in claim 7 wherein the ratio $d_n$ to $d_s$ ranges from about 0.8 to about 0.9.

9. The process as set forth in claim 4 wherein adjacent the dislocation-free neck is an outwardly flaring seed-cone and adjacent the outwardly flaring seed-cone is a body, the body weighing at least about 100 kilograms.

10. The process as set forth in claim 9 wherein the body weighs at least about 200 kilograms.

11. The process as set forth in claim 10 wherein the body weighs at least about 300 kilograms.

* * * * *